United States Patent [19]
Singh et al.

[11] Patent Number: 6,118,301
[45] Date of Patent: Sep. 12, 2000

[54] HIGH VOLTAGE TOLERANT AND COMPLIANT DRIVER CIRCUIT

[75] Inventors: Jaspreet Singh, Detroit, Mich.; Gregory T. Koker; Mark R. Newman, both of Vancouver, Wash.

[73] Assignee: Analog Devices, Inc., Norwood, Mass.

[21] Appl. No.: 09/084,670

[22] Filed: May 26, 1998

[51] Int. Cl.$^7$ ...................... H03K 19/02; H03K 19/0175
[52] U.S. Cl. .................. 326/58; 326/58; 326/57; 326/80; 326/81; 326/83; 326/86; 326/87; 326/121
[58] Field of Search ................ 326/80, 81, 83, 326/86, 57, 58, 27, 121

[56] References Cited

U.S. PATENT DOCUMENTS

| | | | |
|---|---|---|---|
| 5,160,855 | 11/1992 | Dobberpuhl | 307/270 |
| 5,352,942 | 10/1994 | Tanaka et al. | 307/475 |
| 5,387,826 | 2/1995 | Shay et al. | 326/21 |
| 5,574,389 | 11/1996 | Chu | 326/81 |
| 5,614,859 | 3/1997 | Ong | 327/333 |
| 5,661,414 | 8/1997 | Shigehara et al. | 326/81 |
| 5,834,948 | 11/1998 | Yoshizaki et al. | 326/81 |
| 5,917,361 | 6/1999 | Wong et al. | 327/391 |
| 5,952,847 | 9/1999 | Plants et al. | 326/80 |

*Primary Examiner*—Michael Tokar
*Assistant Examiner*—Vibol Tan
*Attorney, Agent, or Firm*—Koppel & Jacobs

[57] ABSTRACT

An input/output driver circuit which provides a buffer interface between a functional digital circuit and a common bus for other digital circuits achieves high levels of voltage tolerance and compliance, while requiring only two power supply pins, by using two PMOS switching transistors between the circuit's output line and an output power supply terminal, rather than only one. To turn the transistors OFF, the output power supply voltage is applied to the gate of one of them and the output line voltage to the gate of the other. This assures that at least one of the transistors is fully OFF when desired, whether or not the output line voltage exceeds the output power supply level.

31 Claims, 3 Drawing Sheets

HIGH VOLTAGE TOLERANT AND COMPLIANT DRIVER CIRCUIT

BACKGROUND OF THE INVENTION

1. Field of the Invention

This invention relates to driver circuits which provide a digital input/output interface, and more particularly to driver circuits that can tolerate voltages greater than their power supplies and can produce outputs at voltage levels different from their internal operating voltages.

2. Description of the Related Art

Input and output buffer circuits are commonly used to interface between multiple digital circuits such as memory and DSP (digital signal processing) chips. The buffer driver circuits are often subjected to multiple voltage levels. For example, a driver circuit that is designed to produce a 3.3 volt output, and thus operates from a 3.3 volt output power supply, may receive 5 volt signals if it is connected to a bus that receives 5 volt outputs from other chips. This may result, for example, from the two chips using different types of logic families. Furthermore, the drivers commonly have input and output stages that operate off of separate power supplies, with the input stage isolated from the output power supply to protect it from the output switching noise. The input power supply level may either be the same as or different from the output power supply level, depending upon the application.

Two characteristics that are desirable in a driver circuit of this type are tolerance and compliance. "Tolerance" refers to an ability to withstand voltages greater than the power supply level. For example, a driver that had a 3.3 volt output power supply and could tolerate 5 volts received from a common bus would be said to have a 5 volt tolerance (or whatever greater voltage level it could withstand). "Compliance" refers to the ability to produce a higher voltage on the driver's output than the power supply level used for the main portion of the driver circuitry. A compliance to a higher voltage generally requires that the driver's output power supply be at the higher voltage. For example, a driver with a 3.3 volt input power supply but a 5 volt output power supply capable of producing 5 volt outputs would be said to be compliant to 5 volts.

Higher output than input power supplies are commonly used to bias input protection circuitry, resulting in a tolerance up to the output power supply level (plus about 0.3 volts). However, the user may elect to set the output power supply equal to the input power supply level, perhaps because the only power supply available to the user is at the input power supply level, or because other circuits connected to the common bus could not withstand higher voltages being driven onto the bus. In such a case the driver's tolerance would drop to the input power supply level.

Since it is unpredictable at the manufacturing stage for any given part whether the ultimate user will operate the output power supply at the input power supply level or a higher level, it would be desirable for a driver circuit to be able to maintain both high tolerance and compliance levels regardless of whether the part uses an output power supply equal to or greater than the input power supply level. This challenge is likely to increase in the future as still lower power supply levels are phased in. At present the standard power supply levels are 2.5, 3.3 and 5 volts (all±10%). An effort is now underway to drop the power supply level to 1.8 volts, and thereafter to perhaps 1.0 volts.

Various buffer driver circuits are described in U.S. Pat. Nos. 5,574,389 to Chu, 5,160,855 to Dobberpuhl and 5,387,826 to Shay et al. While exhibiting compliance, the Chu patent is not very tolerant; the Dobberpuhl patent has a good tolerance level but is not compliant; Shay et al. exhibits low levels of both tolerance and compliance.

A simplified illustration of a conventional buffer driver circuit is presented in FIG. 1. It includes an input stage 2 powered from an input power supply terminal 4 with one input 6 which provides a HI or LO input logic signal, and an enable input 8 that receives a signal which either enables or disables the input stage. The input stage produces an output switching signal in the form of a pair of control signals, with one control signal supplied to the gate of a PMOSFET (p-channel metal oxide semiconductor field effect transistor) T1 and a second control signal supplied to the gate of an NMOSFET (n-channel MOSFET) T2. The gates of these transistors act as control inputs for their respective source-drain current circuits. The current circuits of T1 and T2 are connected in series between an output power supply terminal 10 and a ground connection, with the source of T1 connected to terminal 10, the drain of T2 grounded and the drain of T1 connected to the source of T2. The transistors' well connections are indicated by arrows, with the well of T1 connected to its source and the output power supply terminal 10, and the well of T2 connected to its drain and ground. An output terminal 12 is tapped off the connection between the two transistors.

With the input stage 2 enabled and a LO input signal, high voltages are applied to the gates of both T1 and T2, turning T1 OFF and T2 ON. This grounds the output terminal 12 through T2, producing a LO output in response to the LO input on input line 6. With a HI logic input, the input stage 2 sets the gate voltages of both T1 and T2 at ground, turning T1 ON and T2 OFF. This causes the output power supply level to appear at the output terminal 12 via T1. For a TRISTATE input, in which the enable input line 8 is held LO so that the circuit can receive a signal from a common bus connected to the output terminal 12, the input stage 2 applies a HI signal to the gate of T1 and a LO signal to the gate of T2, turning both transistors OFF and allowing the output terminal to float pending the receipt of a signal from the common bus.

With this circuit, if the input power supply is 2.5 volts and the output power supply 3.3 volts, some portion of the input stage must also be powered by 3.3 volts to be able to produce a 3.3 volt gate signal for T1 to turn that transistor OFF during either a LO or a TRISTATE input. But this pierces the input stage's isolation from the output power supply, thus allowing for the possibility of output switching noise getting back into the input stage, and also requires that the wells of the PMOSFETs in the input stage be connected to 3.3 volts.

If, on the other hand, the output power supply is set equal to the input power supply at 2.5 volts rather than 3.3 volts, the circuit can no longer tolerate a 3.3 volt signal applied to the output terminal 12 from some other circuit. This is because the gate voltage applied to T1 to turn it OFF is 2.5 volts, which allows T1 to be turned back ON if the voltage at the output terminal 12 rises above about 3 volts. With a 3.3 volt signal at the output terminal, a substantial current will flow through T1 to the output power supply terminal 10. This current can be on the order of milliamps or greater, as opposed to the usual requirement that leakage currents be limited to not more than about 10 microamps. In essence the output terminal 12 shorts to the output power supply terminal 10 through T1.

The circuit can be made both tolerant and compliant by operating both the input and output power supplies at 2.5 volts, and supplying a third power supply at 3.3 volts for the wells of the PMOS devices in the output stage and also for the gate of T1. However, this requires the addition of a third power supply pin. The addition of any power supplies can result in leakage between the new and the original power supplies, extra ESD (electrostatic discharge) problems, and may require the addition of special circuitry to withstand the higher voltage. It also makes the circuit more difficult to use, since for example the power supplies must be turned ON in the correct sequence. It also makes it more difficult to document and test, since all combinations of power supplies must be tested at all of their limits. The result is more tests, additional cost and in general a more difficult customer support situation.

SUMMARY OF THE INVENTION

The invention seeks to provide a driver circuit, for interfacing between a digital input and an output line, that has a high level of both voltage tolerance and compliance, and yet requires only two power supply pins. This is accomplished by dividing the switch between the output power supply and the output line (T1 in FIG. 1) into a pair of separate switches whose current circuits are connected in series, and providing a control circuit that turns at least one of the two switches OFF in response to a DRIVE LO or a TRISTATE input logic signal, regardless of whether the voltage on the output line equals or differs from the voltage on the output power supply terminal, and that turns both of the switches ON in response to a DRIVE HI input signal.

In a preferred embodiment the switch pair is implemented by PMOS transistors and an associated well bias circuit that biases the PMOS wells to the higher of the voltages on the output power supply terminal and the output line. To turn the switch circuit fully OFF, the output power supply voltage is applied to the gate of one of the transistors and the output line voltage to the gate of the other, causing whichever transistor that receives the higher gate voltage to be fully OFF. A third switch, preferably an NMOS transistor, connects the output line to ground in response to a DRIVE LO input. One or the other of the PMOS transistors is biased fully OFF in response to a DRIVE LO or a TRISTATE input, depending upon the voltage at the output power supply terminal relative to the voltage at the output line.

A digital network can be established by connecting a number of functional digital circuits to a common bus through respective driver circuits as described above. The driver circuits exhibit compliance, since for example their input stages can operate from 2.5 volts with their output stages providing a 3.3 volt signal to the common bus, and they can also tolerate 3.3 or even 5 volt signals received from the common bus.

These and other features and advantages of the invention will be apparent to those skilled in the art from the following detailed description, taken together with the accompanying drawings, in which:

DETAILED DESCRIPTION OF THE INVENTION

Figure 2:
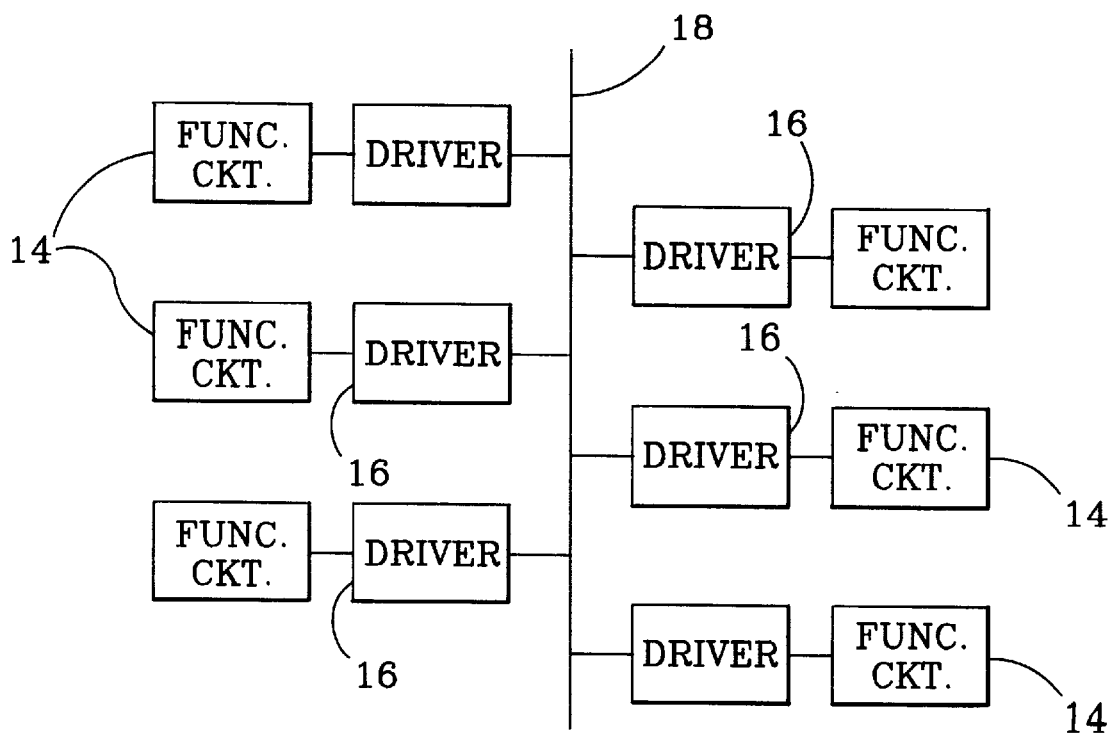
FIG. 2 is a block diagram of a digital network with the new driver circuits interfacing between a number of functional digital circuits and a common bus.

FIG. 2 illustrates the general configuration of a digital network in which a number of different functional circuits 14, such as memory or DSP chips, interface through respective input/output buffer driver circuits 16 with a common bus 18. The functional circuits communicate with each other via the common bus; the driver circuits 16 condition the signals from their respective functional circuits for delivery to the common bus.

In general, only one functional circuit at a time will output signals to the common bus, and that circuit will receive an ENABLE input. All of the other functional circuits would be in a receive mode during this time, providing TRISTATE inputs to their respective drivers which allow the driver outputs to float. For example, a memory chip could be written to with a TRISTATE input to its driver circuit, while it could be read out by supplying an ENABLE input to the driver circuit.

Figure 3:
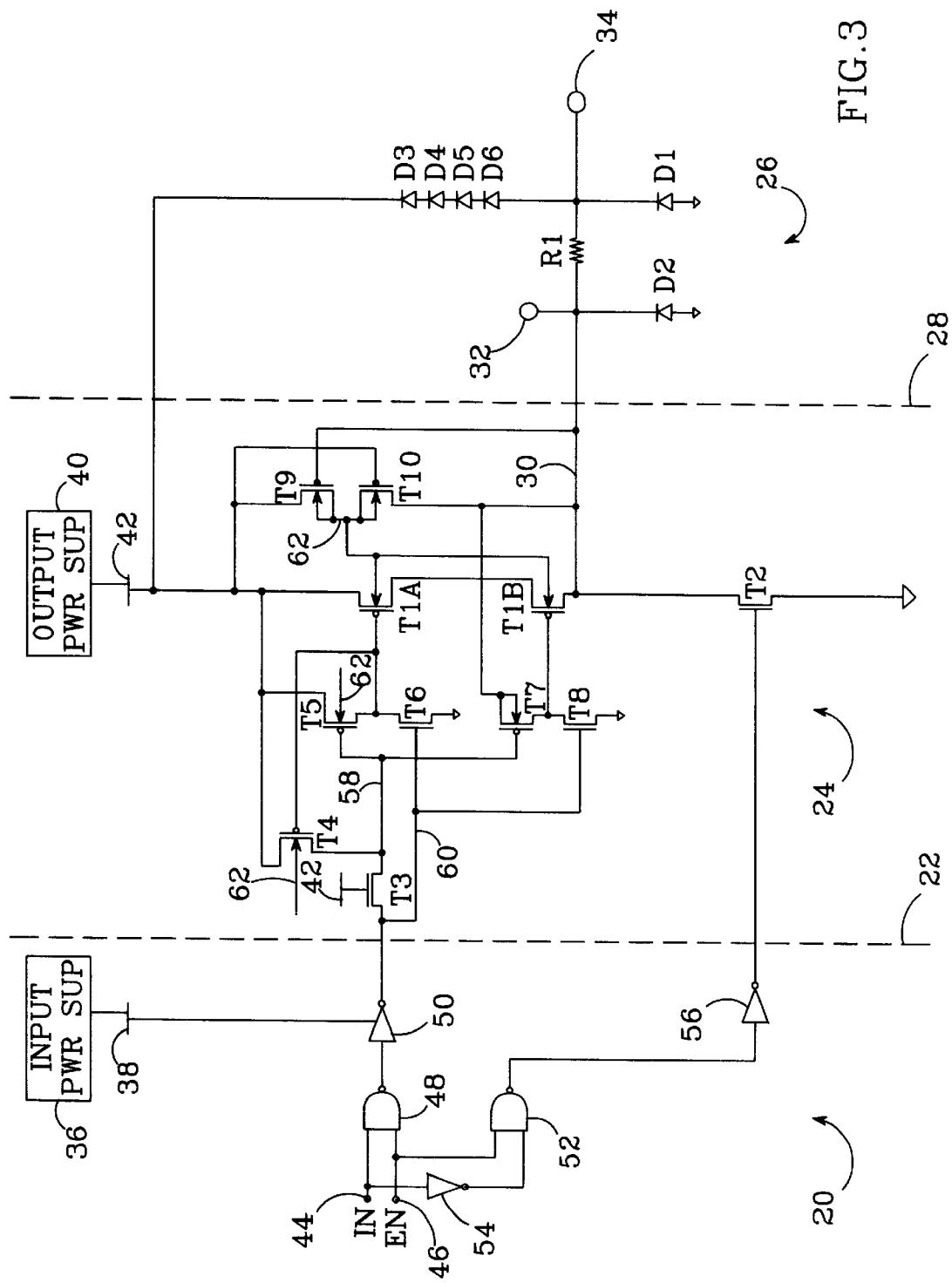
FIG. 3 is a schematic diagram of a driver circuit incorporating one embodiment of the invention.

The different functional circuits might operate with different power supply levels, giving rise to the problems of maintaining both compliance and tolerance discussed previously. A driver circuit that provides both characteristics, while requiring only two power supply pins, is shown in FIG. 3. It includes an input stage 20 (to the left of the dashed line 22) that receives inputs from an associated functional circuit and outputs a switching signal to an output stage 24 (to the right of dashed line 22), and an ESD protection circuit 26 (to the right of dashed line 28). In response to an ENABLE input to the input stage, the output stage produces a logic signal on an output line 30, which includes an output terminal or pad 32. The signal on output line 30 corresponds to the digital input to the input stage. Input/output pin (terminal) 32 in turn can be connected to a common bus for driving other chips with the output logic signal. Signals from the common bus are received at an input terminal 34, which is connected to the output line via an input protection resistor R1, when a TRISTATE input is applied to the input stage.

The input stage is powered from an input power supply 36 that applies a voltage signal to an input power supply terminal 38 on the driver chip, while the output stage is powered by an output power supply 40 that supplies another voltage signal to an output power supply terminal 42 on the driver chip. For purposes of discussion it will be assumed that the input and output power supplies provide 2.5 and 3.3 volt signals, respectively, although other voltage levels could also be used.

The input stage receives an input digital signal from its associated functional circuit at a pair of terminals 44 and 46, with terminal 44 receiving an input logic signal which may be either HI or LO at any particular time, and terminal 46 receiving either an ENABLE or a TRISTATE signal.

A key to the invention is that, within the output stage, the single switching transistor T1 used in previous driver circuits to apply the output power supply voltage to the output line is broken into two separate switching transistors T1A and T1B whose source-drain current circuits are connected in series between the output power supply terminal 42 and the output line 30, and whose gates are separately controlled in response to a switching signal from the input stage. The transistors T1A and T1B are preferably implemented as PMOSFETs. To assure that at least one of them is fully OFF in response to either a LO or a TRISTATE input from the functional circuit, resulting in a true disconnection between the output line 30 and the output power supply terminal 42 even if the voltage received by the output line from a common bus is greater than the output power supply voltage, the gate of one of the two transistors is connected to the output line and the gate of the other transistor is connected the output power supply terminal. This assures that at least one of the two transistors is fully OFF. In one embodiment the connection between one of the transistor gates and the external power supply terminal is made via a common transistor well. In addition, a well bias circuit provides a good well bias for the PMOS transistors, whether or not the output line voltage exceeds the output power supply voltage, by biasing the PMOS wells to the voltage on either the output power supply terminal or the output line, whichever is higher.

The input stage includes a NAND gate 48 that receives inputs from the terminals 44 and 46 and that provides an output switching signal for T1A and T1B after inversion by inverter 50. The inverter is connected to be powered from the input power supply terminal 38; other elements of the input stage that require a power drive are also supplied from the input power supply terminal, although such connections are not shown to avoid cluttering the figure.

Figure 1:
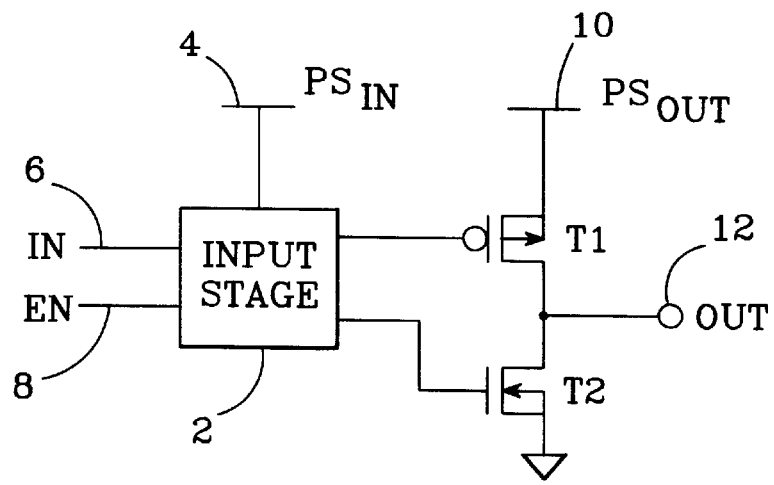
FIG. 1, described above, is a simplified schematic diagram of a conventional driver circuit.

Another NAND gate 52 receives one input via an inverter 54 from the logic input terminal 44, and another input directly from the ENABLE terminal 46. It provides an output that, after inversion by an inverter 56, is applied to the gate of switching transistor T2 in the output stage to control the operation of that transistor. T2, which is preferably an NMOSFET, connects the output line 30 to an output ground in response to a LO input signal, as in the prior circuit of FIG. 1.

The output stage includes a control circuit for T1A and T1B which converts the input power supply voltage swing (such as 2.5 volts) at the output of inverter 50 to at least the possibly higher output power supply voltage swing (such as 3.3 volts) for application to the gates of T1A and T1B. This circuit includes an NMOS transistor T3 with its source connected to the output of inverter 50, its drain connected to a first control line 58, and its gate connected to the output power supply terminal 42 to hold it ON; a PMOS transistor T4 with its source-drain circuit connected between the output power supply terminal 42 and control line 58; a first pair of CMOS (complementary metal-oxide-semiconductor) transistors comprising PMOS transistor T5 and NMOS transistor T6 which control the signal applied to the gates of T1A and T4; and a second pair of CMOS transistors comprising PMOS transistor T7 and NMOS transistor T8 which provide a control signal to the gate of T1B. The gates of PMOS devices T5 and T7 are connected to control line 58 at the drain of T3, while the gates of NMOS devices T6 and T8 are connected to a second control line 60 at the source of T3. This allows for a faster switching of T6 and T8 because control line 58 experiences slower voltage transitions than does control line 60, due to the influence of the output power supply via T4 on control line 58.

The unique configuration of two separate transistors T1A and T1B for switching between the output power supply terminal 42 and the output line 30 makes it possible for the circuit to tolerate a higher voltage on the output line, such as 5 volts, while still maintaining a compliance to 3.3 volts with a 2.5 volt internal power supply and using only two power supply pins. When it is desired to disconnect the output power supply terminal from the output line, as in response to a LO or a TRISTATE input to the input stage, one or the other of T1A or T1B is held fully OFF, depending upon the voltage at the output power supply terminal 42 relative to the voltage at the output line 30. The term "fully OFF" does not imply an absolute zero current flow, but rather means that any current leakage through the transistor is kept to a very low level within allowable tolerances (typically less than one microamp).

A fully OFF condition is achieved by connecting the source-drain circuit of T5 between the output power supply terminal 42 and the gate of T1A, while the source-drain circuit of T7 is connected between the output line 30 and the gate of T1B. Thus, when the voltage on control line 58 is LO to turn T5 and T7 ON and thus hold T1A and T1B OFF, the output power supply voltage is applied to the gate of T1A via T5, while the output line voltage is applied to the gate of T1B via T7. If the output line 30 is at 5 volts and the output power supply terminal 42 at 3.3 volts, which might otherwise cause a serious leakage through T1A, the application of the higher output line voltage to the gate of T1B assures that T1B is fully OFF, thus securely disconnecting the output line from the output power supply terminal. Conversely, if the voltage on output line 30 is less than the output power supply voltage, which might otherwise cause a leakage through T1B, the application of the higher output power supply voltage to the gate of T1A holds that transistor fully OFF to disconnect the output power line from the output power supply terminal.

To turn T1A and T1B OFF, a LO signal on control line 60 keeps T6 and T8 OFF, disconnecting the gates of T1A and T1B from ground. However, when it is desired to drive a HI logic signal onto the output line, the signals on control lines 58 and 60 go HI (T4 causes the 3.3 volt output power supply level rather than the 2.5 volt input power supply level to appear at the gates of transistors T5 and T7), turning PMOS devices T5 and T7 OFF while turning NMOS devices T6 and T8 ON. The gates of T1A and T1B are thus connected to ground respectively via T6 and T8, and accordingly turn ON to apply the output power supply voltage to the output line 30.

T2 is operated in a conventional fashion to connect the output line 30 to ground in response to a LO input signal, and to decouple the output line from ground in response to both HI and TRISTATE input signals. The appropriate switching control signals for T2 are supplied from the output of inverter 56.

For proper circuit operation it is necessary that the wells of the PMOS transistors in the output stage be connected to the highest voltage to which their respective transistors are exposed. For this purpose a separate well bias circuit consisting of PMOS transistors T9 and T10 is provided for the PMOS transistors (T1A, T1B, T4 and T5) that are exposed to both the output power supply and the output line voltages. The bias circuit preferably comprises a pair of PMOS transistors T9 and T10 whose sourcedrain circuits are connected in series between the output power supply terminal 42 and the output line 30. T9 and T10 are preferably formed in a common well along with T1A, T1B, T4 and T5. For purposes of this invention, a "common" well includes both a single well for all the transistors, and physically separate wells that are electrically connected together in common.

T9 has its gate connected to the output line 30 and, when activated, connects the output power supply terminal 42 to the common well; T10 has its gate connected to the output power supply terminal 42 and when activated connects the output line to the common well. Thus, if the output line voltage is higher than the output power supply, T9 will be held OFF and T10 will connect the output line 30 to the common well; T9 connects the output power supply terminal to the common well and T10 is held OFF when the output line voltage is less than the output power supply. PMOS transistor T7 does not need this type of well bias since it cannot be exposed to the output power supply voltage, and thus does not share the same well as the other PMOS devices. In FIG. 3 the common well for T1A, T1B, T4, T5, T9 and T10 is indicated by reference number 62.

Output line 30 and terminals 32 and 34 are protected from ESD by a diode D1 between terminal 34 and ground, a second diode D2 between terminal 32 and ground, and series-connected diodes D3, D4, D5 and D6 between the output power supply terminal 42 and terminal 34. Multiple diodes are used because the single diode drop of about 0.6 volts does not allow for normal operating voltage differentials between the output power supply terminal and the common bus input terminal 34. Diodes D3–D6 limit the operating voltage that can be applied to terminals 32 or 34 to the output power supply voltage plus about 2.4 volts.

Figure 4:
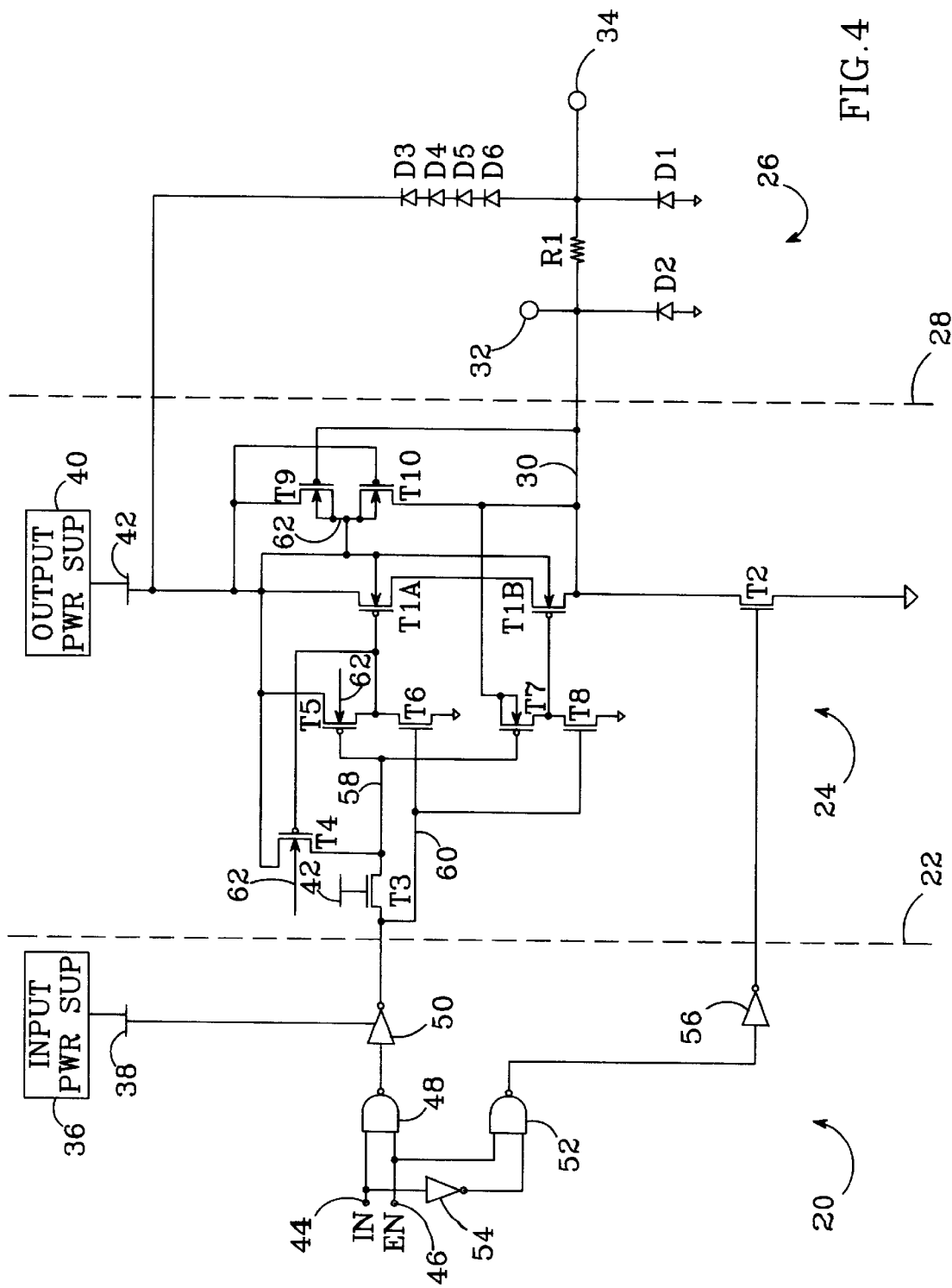
FIG. 4 is a schematic diagram of a second embodiment of the invention, in which the input stage produces a switching voltage for one of the output stage PMOS transistors that is driven between the well voltage and ground, rather than directly between the output power supply voltage and ground as in FIG.1.

FIG. 4 shows a variation of the FIG. 3 circuit in which the sources of T4 and T5 are connected to the common well for these transistors, rather than to the output power supply terminal. In theory the FIG. 4 circuit would work as well as FIG. 3 since T9 applies the output power supply voltage to the common well 62, and thereby via T4 and T5 to the control line 58 and the gate of T1A, when that voltage exceeds the voltage on output line 30. However, it violates the normal design rule of not using the same circuit to drive both the PMOS wells (a low current function) and the gate of a switching transistor (which can be a relatively higher current function).

While the invention is illustrated as being implemented with PMOS switching transistors T1A and T1B, other types of switching devices could also be used, such as N-channel intrinsic devices or depletion devices. In a generic sense, the invention can be implemented with any switching elements that can be turned ON or OFF based upon an applied control voltage. However, if for example NMOS switching transistors were used with a 5 volt output power supply, the transistors could only drive the output line to about 4 volts. While this would still provide some voltage pull up capability, it is not as good as with PMOS switching transistors which can drive the output to the rail voltage with an accompanying reduction in noise margin. Also, an NMOS transistor would not suffer from the leakage problem encountered by a single PMOS switching transistor, since it is turned OFF by a low rather than a high gate control voltage, so there would not be the same need for the invention as with PMOS switching transistors.

Another possible variation is in the nature of the buffer logic circuitry which processes the digital input. The logic elements 48, 50, 52 and 54 of FIGS. 3 and 4 form a non-inverting buffer, in which a HI input at input terminal 44 results in a HI output on output line 30. An inverting buffer could also be used in which a HI input at terminal 44 produces a LO output on output line 30, and vice versa. Thus, the logic circuitry can be generalized by saying that a DRIVE HI signal at input terminal 44 produces a HI signal on output line 30, with the DRIVE HI signal being a logic HI for a non-inverting buffer and a logic LO for an inverting buffer, and vice versa for a DRIVE LO signal at input terminal 44.

While several embodiments of the invention have been shown and described, numerous variations and alternate embodiments will occur to those skilled in the art. Accordingly, it is intended that the invention be limited only in terms of the appended claims.

We claim:

1. A high voltage tolerant and compliant driver circuit for interfacing between a digital input and an output line, comprising:

an input stage that is connected to receive an input digital signal which may be DRIVE HI or DRIVE LO, and operates from an input power supply to produce a switching signal, an output stage that is connected to receive said switching signal and operates from an output power supply, which may be different from said input power supply, to produce an output signal that corresponds to the input signal and has a HI state set by an output power supply, and an output line connected to receive said output signal, said output line being subject to receiving other signals which may differ from said output power supply, said output stage comprising:

an output power supply terminal for receiving a voltage from an output power supply, a pair of switches having respective current circuits connected in series between said output power supply terminal and said output line, and respective control terminals which turn their respective current circuits ON or OFF in response to applied control voltages, a control circuit which turns both of said switches ON in response to a DRIVE HI input signal, and a third switch which connects said output line to a ground terminal in response to a DRIVE LO input signal, wherein said control circuit turns at least one of said switches OFF in response to a DRIVE LO input signal, regardless of whether the voltage on said output line equals or differs from the voltage on said output power supple terminal.

2. A high voltage tolerant and compliant driver circuit for interfacing between a digital input and an output line, comprising:

an input stage that is connected to receive an input digital signal which may be DRIVE HI or DRIVE LO, and operates from an input power supply to produce a switching signal, an output stage that is connected to receive said switching signal and operates from an output power supply, which may be different from said input power supply, to produce an output signal that corresponds to the input signal and has a HI state set by an output power supply, and an output line connected to receive said output signal, said output line being subject to receiving other signals which may differ from said output power supply, said output stage comprising:

an output power supply terminal for receiving a voltage from an output power supply, a pair of switches having respective current circuits connected in series between said output power supply terminal and said output line, and respective control terminals which turn their respective current circuits ON or OFF in response to applied control voltages, a control circuit which turns both of said switches ON in response to a DRIVE HI input signal, wherein said control circuit turns at least one of said switches OFF in response to a DRIVE LO input signal, regardless of whether the voltage on said output line equals or differs from the voltage on said output power supply terminal, and wherein said input state is also connected to receive a TRISTATE input signal, and said control circuit turns said at least one switch OFF in response to a TRISTATE input signal.

3. The driver circuit of claim 2, said pair of switches comprising PMOS transistors with source-drain circuits functioning as said current circuits and gates functioning as said control terminals, wherein, in response to a DRIVE LO or a TRISTATE input signal, said control circuit biases one or the other of said PMOS transistors fully OFF, depending upon the voltage at said output power supply terminal relative to the voltage at said output line.

4. The driver circuit of claim 3 wherein, in response to a DRIVE LO or a TRISTATE input signal, said control circuit connects the voltage at said output power supply terminal to the gate of the PMOS transistor whose source-drain circuit is connected to that terminal, and the voltage at said output line to the gate of the PMOS transistor whose source-drain circuit is connected to the output line.

5. The drive circuit of claim 2, said pair of switches comprising PMOS transistors with source-drain circuits functioning as said current circuits and gates functioning as said control terminals, said PMOS transistors comprising first and second PMOS transistors having one terminal of their source-drain circuits connected respectively to said output power supply terminal and to said output line, and the opposite terminals of their source-drain circuits connected together, and said control circuit comprising first and second gate drive circuits which connect the gates of said first and second PMOS transistors respectively to the voltages at said output power supply terminal and at said output line in response to a DRIVE LO or a TRISTATE input signal, and to a ground in response to a DRIVE HI input signal.

6. The drive circuit of claim 5, said first and second gate drive circuits comprising (a) respective pairs of CMOS transistors connected respectively in series between said output power supply terminal and ground, and between said output line and ground, with the gates of said first and second PMOS transistors connected between the transistors of said first and second CMOS pairs, respectively, and (b) a gate drive bias circuit which biases the gates of said CMOS pairs in response to the input signal.

7. The driver circuit of claim 6, wherein each of said CMOS pairs includes a PMOS transistor and an NMOS transistor, and said gate drive bias circuit provides a higher OFF bias voltage level for the PMOS than for the NMOS transistors of said CMOS pairs.

8. The drive circuit of claim 2, said pair of switches comprising PMOS transistors with source-drain circuits functioning as said current circuits and gates functioning as said control terminals, said PMOS transistors comprising first and second PMOS transistors having one terminal of their source-drain circuits connected respectively to said output power supply terminal and to said output line, and the opposite terminals of their source-drain circuits connected together, and said control circuit comprising first and second gate drive circuits which connect the gates of said first and second PMOS transistors respectively to the voltages at their wells and at said output line in response to a DRIVE LO or a TRISTATE input signal, and to a ground in response to a DRIVE HI input signal.

9. A high voltage tolerant and compliant driver circuit for interfacing between a digital input and an output line, comprising:

an input stage that is connected to receive an input digital signal which may be DRIVE HI or DRIVE LO, and operates from an input power supply to produce a switching signal, an output stage that is connected to receive said switching signal and operates from an output power supply, which may be different from said input power supply, to produce an output signal that corresponds to the input signal and has a HI state set by an output power supply, and an output line connected to receive said output signal, said output line being subject to receiving other signals which may differ from said output power supply, said output stage comprising:

an output power supply terminal for receiving a voltage from an output power supply, a pair of switches having respective current circuits connected in series between said output power supply terminal and said output line, and respective control terminals which turn their respective current circuits ON or OFF in response to applied control voltages, a control circuit which turns both of said switches ON in response to a DRIVE HI input signal, said pair of switches comprising PMOS transistors with source-drain circuits functioning as said current circuits and gates functioning as said control terminals, and further comprising a well bias circuit connected to bias the PMOS wells to the higher of the voltages on said output power supply terminal and on said output line.

10. The driver circuit of claim 9, said PMOS transistors having a common well and a common well bias circuit.

11. The driver circuit of claim 9, said well bias circuit comprising first and second MOSFET transistors having their sources connected respectively to said output power supply terminal and to said output line, their drains connected to the wells of said PMOS transistors, one of their gates connected to said output power supply terminal and the other of their gates connected to said output line.

12. The driver circuit of claim 11, wherein said first and second MOSFET transistors comprise PMOS transistors having their gates connected respectively to said output line and to said output power supply terminal.

13. A switching circuit for controlling a connection between first and second nodes which may be at different voltage levels, comprising:

first and second PMOS transistors connected in series between said nodes with one terminal of their source-drain circuits connected respectively to said first and second nodes, and the opposite terminals of their source-drain circuits connected together, a well bias circuit connected to bias the wells of said PMOS transistors to the higher of the voltages on said nodes, and a gate drive circuit which applies the voltages at said first and second nodes to the gates of said first and second PMOS transistors, respectively, in response to an OFF control signal.

14. The switching circuit of claim 13, wherein said gate drive circuit applies a ground potential to the gates of said PMOS transistors in response to an ON control signal.

15. The switching circuit of claim 13, said PMOS transistors having a common well and a common well bias circuit.

16. The switching circuit of claim 15, said well bias circuit comprising first and second MOS transistors having their sources connected respectively to said first and second nodes, their drains connected to the wells of said PMOS transistors, one of their gates connected to said first node and the other of their gates connected to said second node.

17. The switching circuit of claim 13 wherein, in response to an OFF control signal, said gate bias circuit biases one or the other of said PMOS transistors fully OFF, depending upon the voltage at said first node relative to the voltage at said second node.

18. The switching circuit of claim 17 wherein, in response to an OFF control signal, said gate drive circuit connects said first node to the gate of the first PMOS transistor and said second node to the gate of the second PMOS transistor.

19. The switching circuit of claim 13, said gate drive circuit comprising first and second drive circuits which connect the gates of said first and second PMOS transistors respectively to said first and second nodes in response to an OFF control signal, and to a ground in response to an ON control signal.

20. The switching circuit of claim 19, said first and second gate drive circuits comprising (a) respective pairs of CMOS transistors connected respectively in series between said first node and ground, and between said second node and ground, with the gates of said first and second PMOS transistors connected between the transistors of said first and second CMOS pairs, respectively, and (b) a gate drive bias circuit which biases the gates of said CMOS pairs in response to the control signal.

21. The switching circuit of claim 20, wherein each of said CMOS pairs includes a PMOS transistor and an NMOS transistor, and said gate drive bias circuit provides a higher OFF bias voltage level for the PMOS than for the NMOS transistors of said CMOS pairs.

22. A digital network, comprising:
a plurality of functional digital circuits,
a common bus providing a communications link between said digital circuits, and
a plurality of high voltage tolerant and compliant driver circuits interfacing between respective ones of said digital circuits and said common bus, each of said driver circuits comprising:
an input stage that is connected to receive an input digital signal which may be DRIVE HI or DRIVE LO, and operates from an input power supply to produce a switching signal, and
an output stage that is connected to receive said switching signal and operates from an output power supply, which may be different from said input power supply, to produce an output signal that corresponds to the input signal and has a half state set by an output power supply, said output stage comprising:
an output power supply terminal for receiving a voltage from an output power supply,
a pair of switches having respective current circuits connected in series between said output power supply terminal and said output line, and respective control terminals which turn their respective current circuits ON or OFF in response to applied control voltages, and
a control circuit which turns both of said switches ON to connect the output power supply terminal in circuit with the common bus in response to a DRIVE HI input signal,
wherein said control circuit turns at least one of said switches OFF to disconnect the output power supply terminal from the common bus in response to a DRIVE LO input signal, regardless of whether the voltage on said common bus equals or differs from the voltage on said output power supply terminal.

23. The digital network of claim 22, said output stage further comprising a third switch which connects said common bus in circuit with a ground terminal in response to a DRIVE LO input signal.

24. The digital network of claim 22, wherein said input stage is also connected to receive a TRISTATE input signal, and said control circuit turns said at least one switch OFF in response to a TRISTATE input signal.

25. The digital network of claim 24 wherein, in response to a DRIVE LO or a TRISTATE input signal, said control circuit biases one or the other of said PMOS transistors fully OFF, depending upon the voltage at said output power supply terminal relative to the voltage at said common bus.

26. The digital network of claim 25 wherein, in response to a DRIVE LO or a TRISTATE input signal, said control circuit connects the voltage at said output power supply terminal to the gate of the PMOS transistor whose source-drain circuit is connected to that terminal, and the voltage at said common bus to the gate of the PMOS transistor whose source-drain circuit is connected to the common bus.

27. The digital network of claim 24, said PMOS transistors comprising first and second PMOS transistors having one terminal of their source-drain circuits connected respectively to said output power supply terminal and to said common bus, and the opposite terminals of their source-drain circuits connected together, and said control circuit comprising first and second gate drive circuits which connect the gates of said first and second PMOS transistors respectively to the voltages at said output power supply terminal and at said common bus in response to a DRIVE LO or a TRISTATE input signal, and to a ground in response to a DRIVE HI input signal.

28. The digital network of claim 27, said first and second gate drive circuits comprising (a) respective pairs of CMOS transistors connected respectively in series between said output power supply terminal and ground, and between said common bus and ground, with the gates of said first and second PMOS transistors connected between the transistors of said first and second CMOS pairs, respectively, and (b) a gate drive bias circuit which biases the gates of said CMOS pairs in response to the input signal.

29. The digital network of claim 24, said PMOS transistors comprising first and second PMOS transistors having one terminal of their source-drain circuits connected respectively to said output power supply terminal and to said common bus, and the opposite terminals of their source-drain circuits connected together, and said control circuit comprising first and second gate drive circuits which connect the gates of said first and second PMOS transistors respectively to the voltages at their wells and at said common bus in response to a DRIVE LO or a TRISTATE input signal, and to ground in response to a DRIVE HI input signal.

30. A digital network, comprising:
a plurality of functional digital circuits,
a common bus providing a communications link between said digital circuits, and
a plurality of high voltage tolerant and compliant driver circuits interfacing between respective ones of said digital circuits and said common bus, each of said driver circuits comprising:

an input stage that is connected to receive an input digital signal which may be DRIVE HI or DRIVE LO, and operates from an input power supply to produce a switching signal, and an output stage that is connected to receive said switching signal and operates from an output power supply, which may be different from said input power supply, to produce an output signal that corresponds to the input signal and has a HI state set by an output power supply, said output stage comprising:

an output power supply terminal for receiving a voltage from an output power supply, a pair of switches having respective current circuits connected in series between said output power supply terminal and said output line, and respective control terminals which turn their respective current circuits ON or OFF in response to applied control voltages, and a control circuit which turns both of said switches ON to connect the output power supply terminal in circuit with the common bus in response to a DRIVE HI input signal, said pair of switches comprising PMOS transistors with source-drain circuits functioning as said current circuits and gates functioning as said control terminals, and further comprising a well bias circuit connected to bias the PMOS wells to the higher of the voltages on said output power supply terminal and on said common bus.

31. The digital network of claim 30, said well bias circuit comprising first and second MOSFET transistors having their sources connected respectively to said output power supply terminal and to said common bus, their drains connected to the wells of said PMOS transistors, one of their gates connected to said output power supply terminal and the other of their gates connected to said common bus.

* * * * *